United States Patent [19]
Sung et al.

[11] Patent Number: 6,005,809
[45] Date of Patent: Dec. 21, 1999

[54] PROGRAM AND ERASE METHOD FOR A SPLIT GATE FLASH EEPROM

[75] Inventors: Hung-Cheng Sung; Di-Son Kuo, both of Hsin-chu; Yai-Fen Lin, Taichung; Chia-Ta Hsieh, Tainan, all of Taiwan

[73] Assignee: Taiwan Semiconductor Manufacturing Company, Ltd., Hsin-Chu, Taiwan

[21] Appl. No.: 09/100,815

[22] Filed: Jun. 19, 1998

[51] Int. Cl.[6] .................................................. G11C 16/02
[52] U.S. Cl. ............................... 365/185.29; 365/185.14; 365/185.18; 365/185.26; 365/218
[58] Field of Search ......................... 365/185.29, 185.14, 365/185.18, 218, 185.26

[56] References Cited

U.S. PATENT DOCUMENTS

| | | | |
|---|---|---|---|
| 4,894,802 | 1/1990 | Hsia et al. | 365/182 X |
| 5,033,023 | 7/1991 | Hsia et al. | 365/185.12 |
| 5,067,108 | 11/1991 | Jeng | 365/185 |
| 5,222,040 | 6/1993 | Challa | 365/185 |
| 5,231,602 | 7/1993 | Radjy et al. | 365/185 |
| 5,258,949 | 11/1993 | Chang et al. | 365/185 |
| 5,349,220 | 9/1994 | Hong | 257/322 |
| 5,357,476 | 10/1994 | Kuo et al. | 365/218 |
| 5,412,608 | 5/1995 | Oyama | 365/218 |
| 5,416,738 | 5/1995 | Shrivastava | 365/185 |
| 5,481,494 | 1/1996 | Tang et al. | 365/185.24 |
| 5,485,423 | 1/1996 | Tang et al. | 365/185 |
| 5,521,866 | 5/1996 | Akaogi | 365/185.29 |
| 5,596,528 | 1/1997 | Kaya et al. | 365/185.24 |
| 5,726,933 | 3/1998 | Lee et al. | 365/185.18 |
| 5,883,832 | 3/1999 | Tempel et al. | 365/185.18 |

*Primary Examiner*—Do Hyun Yoo
*Attorney, Agent, or Firm*—George O. Saile; Stephen B. Ackerman; Billy J. Knowles

[57] ABSTRACT

A method to program data to and erase data from a split gate flash EEPROM to improve programming and erasing speed, and to improve endurance is disclosed. The programming the split gate flash EEPROM cell is accomplished by simultaneously applying a first positive voltage to the control gate, applying a first moderately negative voltage to the semiconductor substrate, applying a slight potential to the drain region to supply a constant programming current, and applying a second positive voltage to the drain region. The first positive voltage, the first moderately negative voltage, the slight positive potential and the second positive voltage are applied for a sufficient time to cause electrons to be trapped on the floating gate. The erasing of the split gate flash EEPROM cell is accomplished by simultaneously applying a large positive voltage to the control gate, applying the first moderately negative voltage to the semiconductor substrate, applying a second moderately negative voltage to the source region, and applying the ground reference potential or floating the drain region. The large positive voltage, the first moderately negative voltage, and the second moderately negative voltage is applied for a sufficient time period to institute Fowler-Nordheim tunneling from the floating gate to the control gate to eliminate any electrons from the floating gate.

44 Claims, 6 Drawing Sheets

PROGRAM AND ERASE METHOD FOR A SPLIT GATE FLASH EEPROM

BACKGROUND OF THE INVENTION

1. Field Of The Invention

This invention relates generally to a class of non-volatile memory devices referred to as split gate flash electrically erasable programmable read-only memory (EEPROM). More particularly, this invention relates to methods and devices to program digital data to and erase digital data from a split gate flash EEPROM cell.

2. Description of Related Art

The structure and application of the flash EEPROM is well known in the art. The flash EEPROM provides the density advantages of an erasable programmable read-only memory (EPROM) that employs ultra-violet light to eliminate the programming with the speed of a standard EEPROM. FIG. 1 illustrates a cross-sectional view of a split gate flash EEPROM cell as disclosed in U.S. Pat. No. 5,067,108 (Jenq). The flash EEPROM cell 100 is formed within a p-type substrate 5. A $n^+$ drain region 10 and a $n^+$ source region 15 is formed within the p-type substrate 5.

A relatively thin gate dielectric 55 is deposited on the surface of the p-type substrate 5. The thin gate dielectric 55 will also be referred to as a tunneling oxide. A polycrystalline silicon floating gate 30 is formed on the surface of the gate dielectric 55 above the channel region 60 between the drain region 10 and source region 15. An interpoly dielectric layer 25 is placed on the floating gate 30 to separate the floating gate 30 from a second layer of polycrystalline silicon that forms a control gate 20. The floating gate 30 is placed such that it overlaps the portion of the source 15 and the channel region 60. Further, the control gate is situated to overlap the drain region 10, the channel region 60, and the floating gate 30.

The structure as shown in Jenq describes the n+ source region 15 defined as the drain region, and the n+ drain region 10 as the source region. However, the current definition in the industry is as described above. The explanation of the erase, program, and read operation according to Jenq has been modified to reflect the current definition of the industry.

The p-type substrate 5 is connected to a substrate voltage generator $V_{sub}$ 45. In most applications of an EEPROM, the substrate voltage generator $V_{sub}$ 45 is set to the ground reference potential (0V).

The source region 15 is connected to a source voltage generator $V_s$ 50. The control gate 20 is connected to the control gate voltage generator $V_{cg}$ 35. And the drain region 10 is connected to the drain voltage generator $V_d$ 40.

The theory of operation for erasing a split gate flash EEPROM as disclosed in Jenq (Col. 5, line 5–Col. 6, line 11) begins with the source region 15 and the drain region 10 supplied with an equal potential of the ground reference potential. The control gate voltage generator $V_{cg}$ 35 and thus the control gate 20 is raised to a predetermined potential $V_e$ (>11V) above the ground reference potential supplied to the source region 15 and the drain region 10. The strong coupling from the floating gate 30 to the p-type substrate 5 and drain region 10 will cause a high voltage drop between the floating gate 30 and the control gate 20. This voltage drop, in turn, causes electrons to tunnel from the floating gate 30 to the control gate 20 by the mechanism of Fowler-Nordheim tunneling. This tunneling occurs due to the locally-enhanced field on the surface of the floating gate 30. The local enhancement of the electric field can be due to the unsmoothed grain size of the floating gate 30, or asperity on the floating gate 30, which is typically made of polysilicon. It can also be due to a purposely created sharp edge on the floating gate 30 through properly designed process.

Once the positive charges are gradually built up on the floating gate 30; i.e. electrons are tunneled away from the floating gate 30 onto the control gate 20, the voltage potential drop between the floating gate 30 and the control gate 20 will continue to decrease until the potential drop can no longer sustain a significant amount of Fowler-Nordheim tunneling.

As further described in Jenq (Col. 6, line 46–Col. 7, line 62) after the cell 100 is erased and the floating gate 30 is positively charged, the programming of the split gate flash EEPROM begins with the drain voltage generator $V_d$ 40 and thus the drain region 10 and the control gate voltage generator $V_{cg}$ 35 and thus the control gate 20 being brought to the ground reference potential (0V). The voltage potential supplied by the source voltage generator $V_s$ 50 to the drain 10 of the selected memory cell 100 is raised to a predetermined potential Vp (>10V) above ground reference potential. The induced surface charge underneath the floating gate 30 will propagate the source potential along the induced channel under the floating gate 30 to the region where the floating gate 30 meets the side wall 26. The floating gate 30 is nearly at a potential proportional to the charge present on the floating gate 30, the capacitance of the floating gate 30, and a programming voltage $V_p$.

If the control gate voltage generator 35 is raised to a moderately positive voltage of approximately the power supply voltage source $V_{cc}$ (approximately 5.0V), the channel region 60 directly beneath the control gate 20 is on, the sub-threshold electron current will begin to flow from drain region 10 towards source region 15. The current will flow through the channel. When the electron reaches the region where the first portion 28 or the control gate 20 meets the side wall 26 of the interpoly dielectric layer 25, the electrons see a steep potential drop, approximately equal to the drain voltage, across the surface region defined by the gap between the control gate 20 and the floating gate 30. The electrons will be accelerated and become heated. Some of them are injected through the relatively thin gate oxide 55 and into the floating gate 30, because of the attractive electrostatic force from the floating gate 30. This process continues until the positive charges on the floating gate 30 are neutralized by the injected electrons and the voltage potential on the floating gate 30 will continue to drop until it can no longer sustain an induced surface channel immediately beneath the floating gate 30.

The charge carriers under the floating gate 30 are now depleted by the drain voltage and a deep depletion region is formed under the floating gate 30.

As long as the surface potential under the floating gate 30 can sustain a high enough voltage drop across the surface region defined by the gap between the floating gate 30 and the control gate 20 to induce hot electrons, the electron injection will continue and negative charges will gradually build up on the floating gate 30. The potential on the floating gate 30 will decrease until it reaches a lower value V,' such that the electron injection current becomes negligible. This then completes a programming cycle.

Because of the high electric field induced across the surface region defined by the gap between the floating gate 30 and the control gate 20, the efficiency of hot electron generation is very high. Furthermore, because there is attractive vertical field from the floating gate, the injection efficiency of hot electron onto the floating gate is also very high. Consequently, the programming current can be maintained at a very low level. This is much smaller than the drain current used in the programming of a conventional EPROM cell, which requires both the drain and the control gate at high voltage and operates the MOS transistor in the current saturation mode. Thus, it is possible to supply the high voltage for a memory array with an on-chip charge pump.

The read operation as described in Jenq (Col. 7 line 65–Col. 8, line 24) of the split gate EEPROM cell is accomplished by conventional scheme. The drain voltage generator $V_d$ 40 is maintained at a ground reference potential. The source voltage generator $V_s$ 50 is maintained at a read voltage, which is typically +2 volts and is much smaller than the programming potential.

In one case, if the floating gate 30 is positively charged, then the channel region 60 directly beneath the floating gate 30 is normally turned on. When the control gate 20 is raised to a read potential of approximately +5.0V, which is smaller than the potential during erase, to turn on the channel region 60 under the first portion 28 of the control gate 20, electrical current will flow from the source 15 to the drain 10. In this manner, the memory cell 100 is sensed at an erased state or '1.' state.

On the other hand, if the floating gate 30 is negatively charged, the region of the channel 60 directly beneath the floating gate 30 is either weakly turned on or is entirely shut off. Thus, even when the control gate 20 and the source region 15 are raised to a read potential, turning on the region of the channel 60 directly underneath the first portion 28 of the control gate 20, the region of the channel 60 underneath the floating gate 30 is not on and thus, the current through the channel 60 is either very small compared to the erased "1" State or is no current at all. In this condition, the cell 100 is sensed to be a programmed state of "0".

U.S. Pat. No. 5,481,494 (Tang et al.) describes a method to erase a stacked gate flash EEPROM. A moderately high positive voltage (approximately 3V) is generated by the source voltage generator $V_s$. Concurrently, the gate control voltage generator $V_{cg}$ is set to a relatively large negative voltage (approximately -10V). The substrate voltage generator $V_s$ are set to the ground reference potential. The drain voltage generator $V_d$ is usually disconnected to allow the drain region to float. Under these conditions there is a large electric field developed across the tunneling oxide in the source region. This field causes the electrons trapped in the floating gate to flow to portion of the floating gate that overlaps the source region. The electrons are then extracted to the source region by the Fowler-Nordheim tunneling.

Further Tang et al. shows a method for tightening the threshold voltage $V_T$ distribution of an array of flash EEPROM cells. The moderately high positive voltage (5V) that is applied to the source regions of the array of flash EEPROM cells and the relatively large negative voltage that is applied to the control gate insure a tighter distribution of the thresholds of the array of cells. The value of a load resistor between the low positive voltage and the source region is simultaneously reduced to a predetermined value so as to compensate for the increased erase time caused by the lowering of the magnitude of the negative constant voltage.

U.S. Pat. No. 5,485,423 (Tang et al.) describes a method of erasure of a stacked gate flash EEPROM. A moderately large positive voltage pulse is generated by a source voltage generator $V_s$. Simultaneously, a negative ramp voltage is developed by a gate control voltage generator $V_{cg}$. A drain voltage generator $V_d$ will be disconnected from the drain to allow the drain to float and the substrate voltage generator will be set to the ground reference potential as above described. This method will achieve an averaging of the tunneling field during the entire erase cycle.

U.S. Pat. No. 5,521,866 (Akaogi) describes a non volatile semiconductor memory device having a floating gate. The memory device is constructed with two wells diffused into the semiconductor substrate. The source and drain are then diffused into the second well with a floating gate and control gate disposed on the surface of the semiconductor substrate much as described in FIG. 1. The erasure process involves applying a positive voltage to each of the two wells.

U.S. Pat. No. 5,231,602 (Radjy et al.) describes a method of erasing a stacked gate flash EEPROM cell by controlling the electric field across the tunneling oxide. The drain is connected through a variable resistor to a programming voltage source and a variable voltage source is connected to the source. The variable voltage source is adjusted between 0 and 5V, while the programming voltage source is set between 5V and 20V. The tunneling current is optimized by adjustment of the variable resistor and the variable voltage.

U.S. Pat. No. 5,596,528 (Kaya et al.) describes a method to program a stacked gate flash EEPROM array will provide a narrow distribution of threshold voltage. The method eliminates the drain-column line loading effect and overcomes word line stress approach because high voltages are eliminated from the wordlines. The gate compaction is accomplished by reverse biasing the source and the substrate. This limits the channel currents in individual cells. If a cell loses its charge, it will be restored by this method.

U.S. Pat. No. 5,412,608 (Oyama) describes a method of erasing a stacked gate flash EEPROM cell by applying a relatively large negative pulse to the control gate followed by a relatively large positive pulse to the control gate. The relatively large negative pulse will erase the stacked gate flash EEPROM cell, while the relatively large positive pulse will equalize the threshold voltages of an array of stacked gate flash EEPROM cells.

SUMMARY OF THE INVENTION

An object of this invention is to provide a method for the erasure of data from a split gate flash EEPROM to improve the erasing speed.

Another object of this invention is to provide a method for programming a split gate flash EEPROM to improve programming speed.

Further, another object of this invention is the improvement of the cycling endurance of the split gate flash EEPROM of this invention.

To accomplish these and other objects a method to program and erase a split gate flash EEPROM cell begins with programming the split gate flash EEPROM cell. The programming the split gate flash EEPROM cell is accomplished by simultaneously applying a first positive voltage to the control gate, applying a first moderately negative voltage to the semiconductor substrate, applying a slight positive potential to the drain region to apply a constant programming current, and applying a second positive voltage to the source region. The first positive voltage, the first moderately negative voltage, the slight positive potential, and the second positive voltage are applied for a sufficient time to cause electrons to be trapped on the floating gate.

The method to program and erase a split gate flash EEPROM cell continues with erasing the split gate flash EEPROM cell. The erasing of the split gate flash EEPROM cell is accomplished by simultaneously applying a large positive voltage to the control gate, applying the first moderately negative voltage to the semiconductor substrate, applying a second moderately negative voltage to the source region, and applying the ground reference potential or floating the drain region. The large positive voltage, the first moderately negative voltage, and the second moderately negative voltage is applied for a sufficient time period to institute Fowler-Nordheim tunneling from the floating gate to the control gate to eliminate any electrons from the floating gate.

The first positive voltage level is from approximately +3.0V to approximately 5.5V, preferably the 3.0V.

The first moderately negative voltage level is from approximately −1.0V to approximately −3.0V, preferably −2.0V.

The large positive voltage level is from approximately +10.0V to approximately +12.0V, preferably +11.0V.

The second positive voltage level is from approximately 9.0V to approximately 10.0V, preferably +9.5V.

The slight positive potential is from approximately 0.6V to approximately 0.8V, preferably 0.7V to supply a constant programming current of −5 µA.

The second moderately negative voltage level is from approximately −1.0V to approximately −3.0V, preferably −2.0V.

The time sufficient to trap electrons on the floating gate is from approximately 2.0 µsec to 20 µsec.

The time sufficient to institute Fowler-Nordheim tunneling and eliminate electrons from the floating gate is from approximately 10 µsec. to approximately 1 m sec.

DETAILED DESCRIPTION OF THE INVENTION

Figure 2:
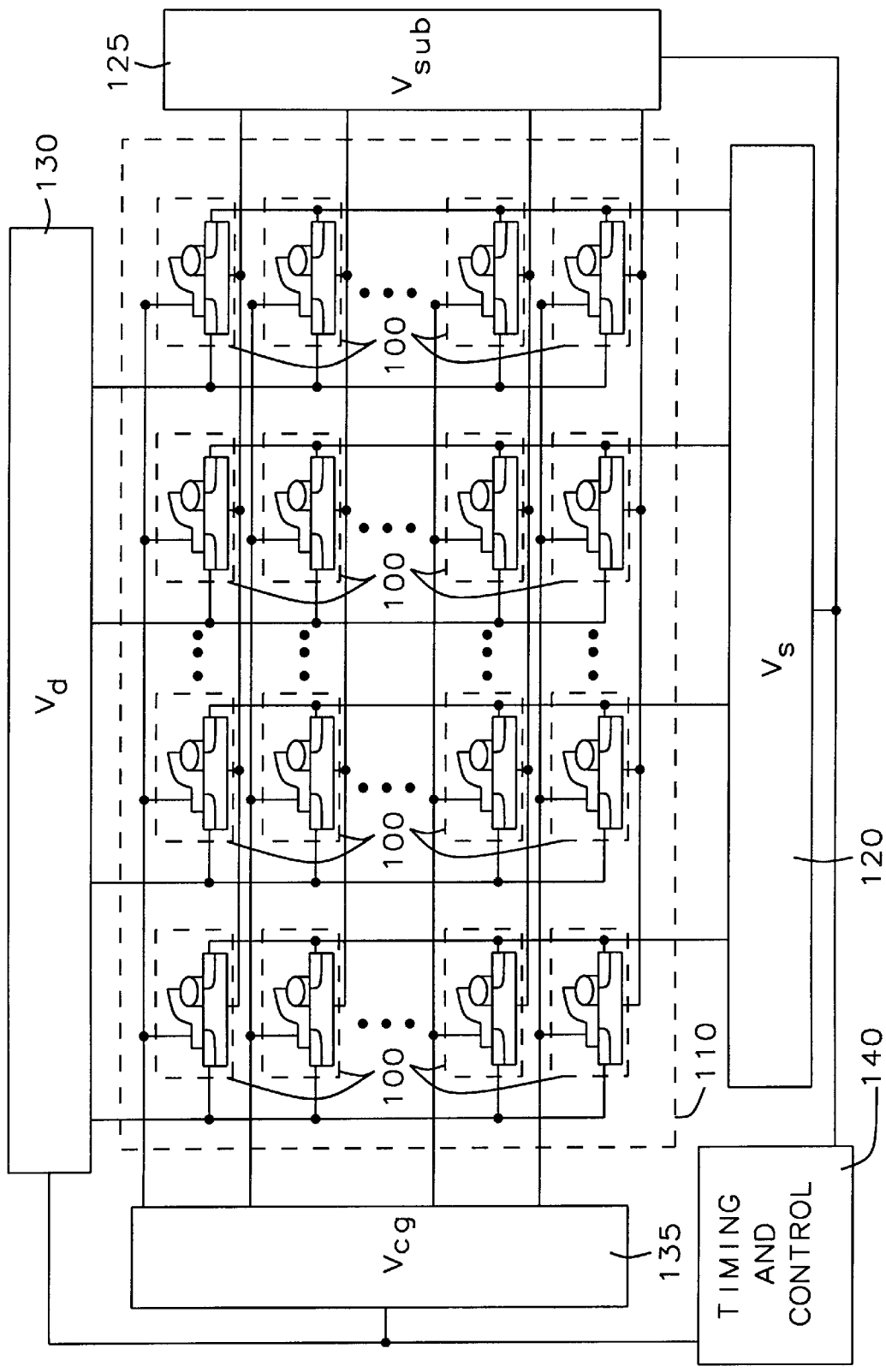
FIG. 2 is an array of split gate flash EEPROM cells showing the connections of the voltage generators of this invention.

Referring now to FIG. 2, an array 110 of split gate flash EEPROM cells 100 are disposed upon a common substrate. For convenience of design, the split gate flash EEPROM cells 100 will be formed into rows and column. The array will have auxiliary circuitry (not shown) that will address the individual split gate flash EEPROM cells 100 for reading from the cells.

The substrate voltage generator $V_{sub}$ 125 is connected to the p-type substrate. The source voltage generator $V_s$ 120 is connected to the source region. The drain voltage generator $V_d$ 130 is connected to the drain region. And the gate control voltage generator $V_{cg}$ 135 to the control gate. The timing and control circuitry 140 in conjunction with the auxiliary circuitry (not shown) will determine the voltages and timings for the substrate voltage generator $V_{sub}$ 125, the source voltage generator $V_s$ 120, the drain voltage generator $V_d$ 130, and the gate control voltage generator $V_{cg}$ 135.

Figure 1:
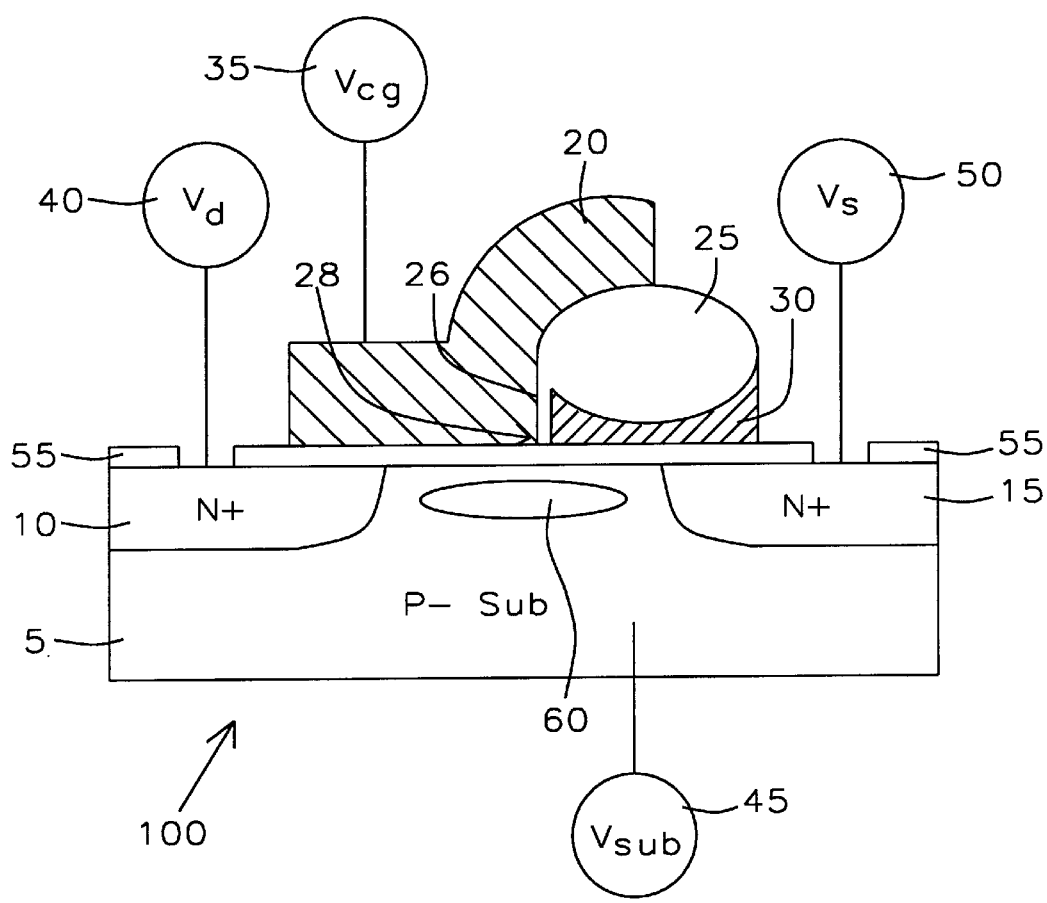
FIG. 1 is cross-sectional view of a split gate flash EEPROM.
Figure 3A:
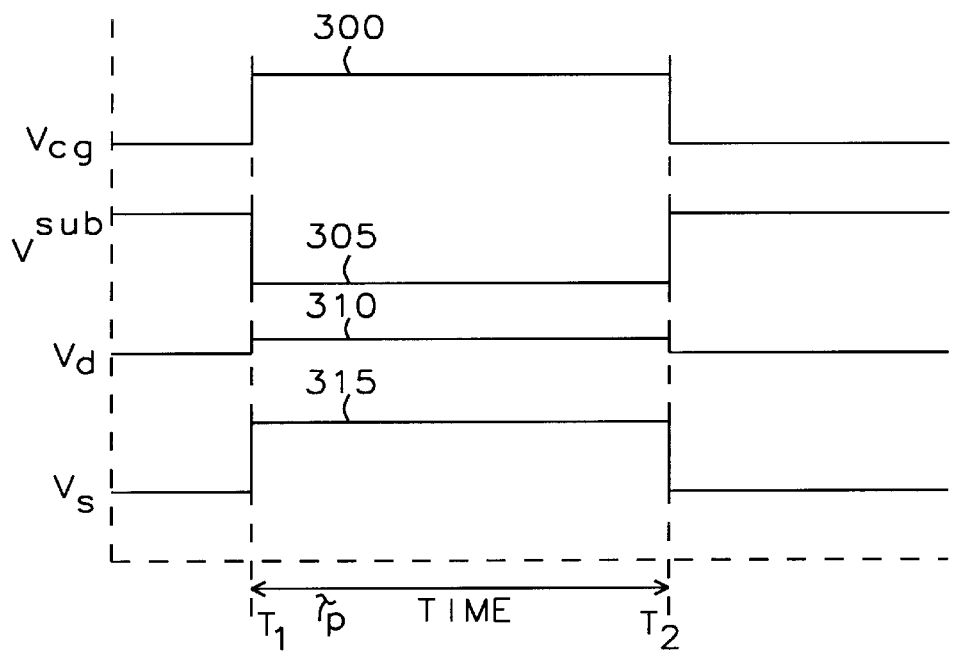
FIGS. 3a and 3b are timing diagrams of a programming cycle and an erase cycle of a split gate flash EEPROM of this invention.

Refer now to FIGS. 1 and 3a for a discussion of the method of programming the split gate flash EEPROM of this invention. At the beginning of the programming cycle $T_1$, the control gate voltage generator $V_{cg}$ 35 is brought to a moderately positive voltage level 300 that is approximately the level of the power supply voltage source $V_{cc}$ (3.0V). The range of the voltages for the control gate voltage generator is from 3.0V to 5.5V. The substrate voltage generator $V_{sub}$ 45 is brought to a first moderately negative voltage level 305 that is approximately −2.0V. The range of voltages of the substrate voltage generator $V_{sub}$ 45 is from −1.0V to −3.0V. The voltage level 310 of the drain voltage generator $V_d$ 40 is set to a voltage so as to supply a constant program current. For example, the voltage will be approximately +0.7V for a program current of −5 µA. The range of the voltage for the drain voltage generator $V_d$ 40 is from approximately 0.6V to approximately 0.8V. The voltage level 315 of the source voltage generator $V_s$ 50 is at a second positive voltage level that is approximately +9.5V. The range of voltages of the source voltage generator $V_s$ 50 is from 9.0V to 10.0V. The programming cycle is completed at time $T_2$. The programming time $\tau_p$ is from approximately 2.0 µsec. to approximately 20.0 µsec.

As described above, the voltage field in the gap between the control gate 20 and the floating gate 30 is important in providing the hot electron injection to the floating gate 30. A larger vertical field improves the time required to program the split gate flash EEPROM cell 100 for any constant programming current.

Figure 4:
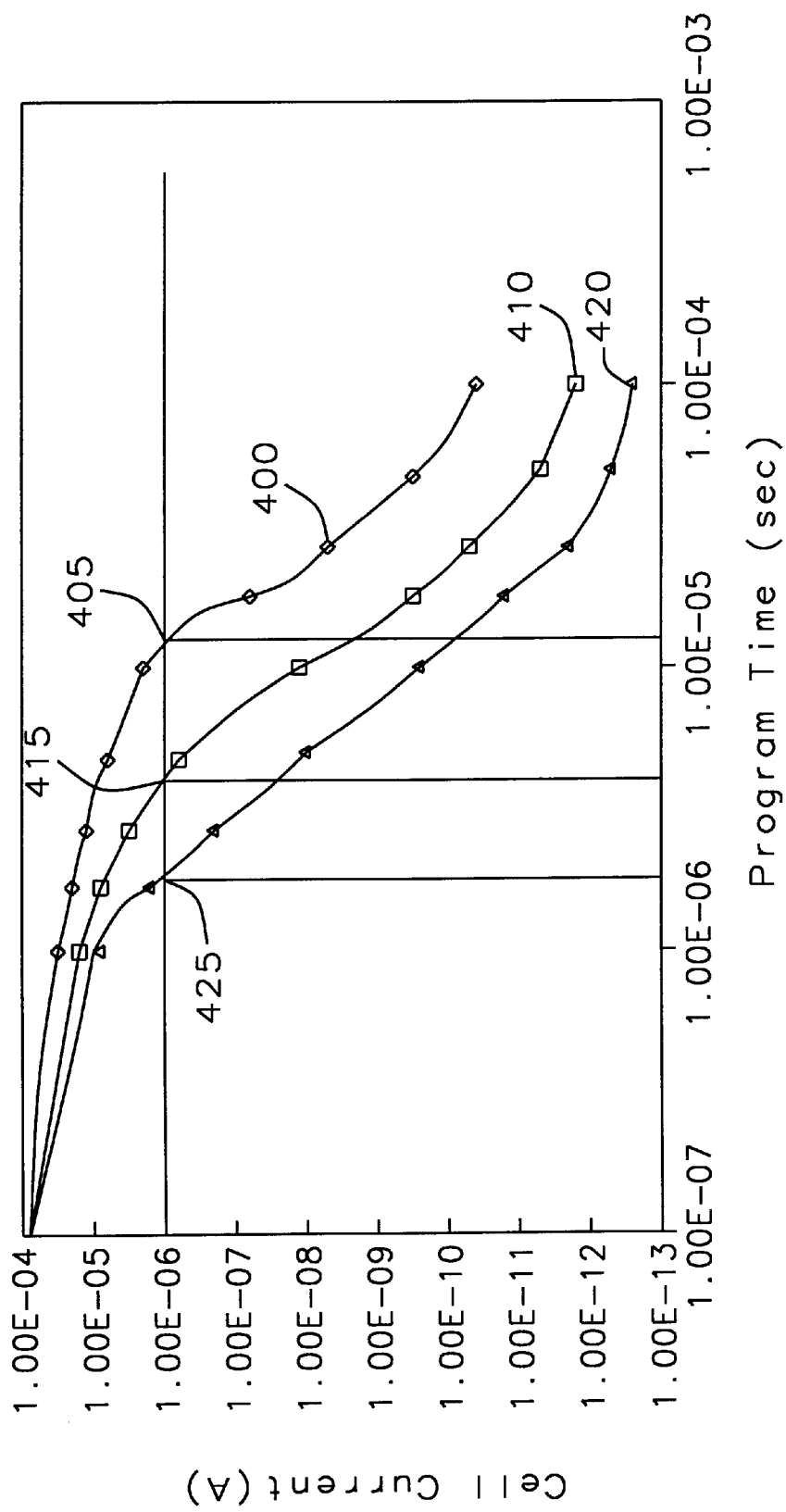
FIG. 4 is a plot of the cell current versus the programming time of the programming cycle time of this invention as compared with the programming cycle time of the prior art.

Refer now to FIG. 4 for a plot of the cell current versus the program time. The cell current is measured with control gate voltage generator $V_{cg}$ 35 set to a voltage level of 3.0V, the source voltage generator $V_s$ 50 set to a voltage level of 2.0V, and the substrate voltage generator $V_{sub}$ 45 set to the ground reference potential. The plot 400 shows the cell current versus the program time for the method of programming a split gate flash EEPROM as described in Jenq. The plot shows that for a cell current of 100 µa the program time 405 is approximately 15 µsec. If the substrate voltage generator $V_{sub}$ 125 is brought a voltage level of −1.0V during the program time $\tau_p$ of FIG. 3a, the plot 410 shows the program time 415 for a cell current of 1.0 µa is approximately 5.0 µsec. If the substrate voltage generator $V_{sub}$ 45 is brought to a voltage level of −2.0V, the plot 410 shows a program time 425 for a cell current of 1.0 µa is approximately 2.5 µsec.

Figure 3B:
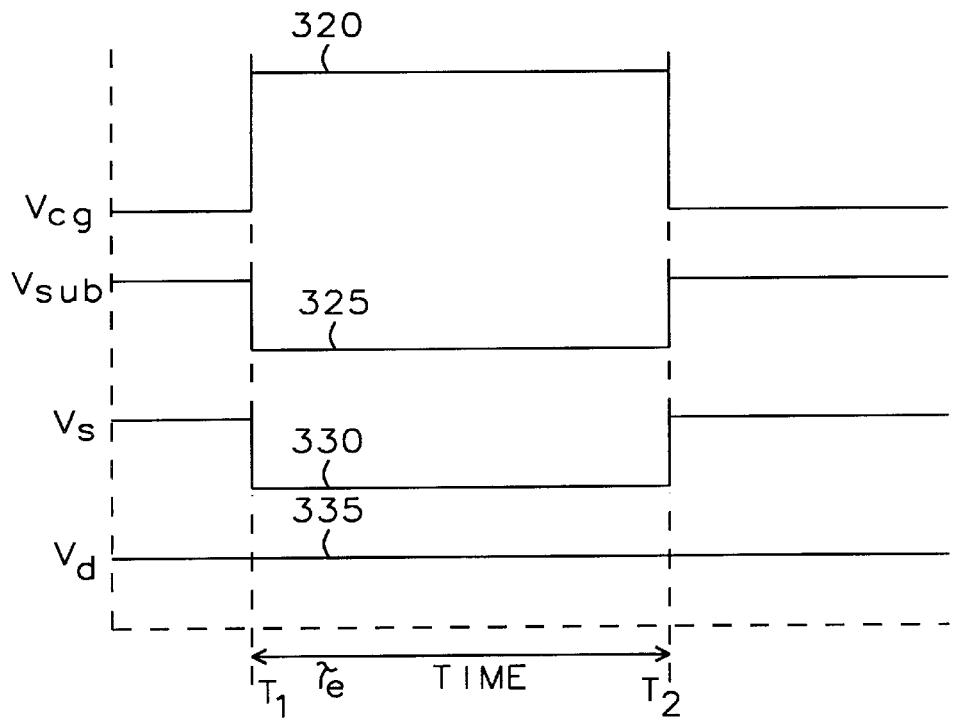

Refer now to FIGS. 1 and 3b for a discussion of the method to erase a split gate flash EEPROM cell of this invention. At the beginning of the erase cycle $T_1$, the control gate voltage generator $V_{cg}$ 35 is brought to relatively large positive voltage 320 that is greater than +11.0V. The range of voltages of the control gate voltage generator $V_{cg}$ 35 is from 10.0V to 12.0V. The substrate voltage generator $V_{sub}$ 45 is set to a first moderately negative voltage level 325 of approximately −2.0V. The range of voltages of the substrate voltage generator $V_{sub}$ 45 is from −1.0V to −3.0V. The source voltage generator $V_s$ 50 is set to a second moderately negative voltage level 330 that is also approximately −2.0V. The range of voltages of the source voltage generator $V_s$ 50 is from −1.0V to −3.0V. The drain voltage generator $V_d$ 40 is simultaneously brought to the level of the ground reference potential (0V). Alternatively, the drain voltage generator $V_d$ 40 may be disconnected from the drain region 10 of FIG. 1 such that the drain region 10 of FIG. 1 is floating. The erase cycle is completed at time $T_2$ and the erase cycle time $\tau_e$ is from 10 μsec. to 1 m sec.

As described above, electrons on the floating gate are injected through the interpoly oxide 25 at the side wall region 26 to the control gate 20. The electric field present in the interpoly dielectric layer 25 is proportional to the voltage drop between the control gate 20 and the float gate 30. The voltage drop between the control gate 20 and the float gate 30 is determined by the formula:

$$V_{cg} - V_{fg} = V_{cg} - [CGR * V_{cg} + (1-CGR) * V_{sub}]$$

Where:

$V_{cg}$ is the voltage of the control gate 20, $V_{fg}$ is the voltage of the floating gate 30, $V_{sub}$ is the voltage present at the substrate 5, CGR is the coupling ratio of the floating gate 30.

The coupling ratio of the floating gate of a split gate flash EEPROM cell 100 is from approximately 20% to approximately 30%, typically approximately 25%.

The voltage drop between the floating gate 30 and the control gate 20 is then simplified to:

$$V_{fg} = 0.75 * (V_{cg} - V_{sub})$$

It is apparent that the higher the voltage difference between the control gate 20 and the substrate 5 will increase the effectiveness of the erase process.

Figure 5:
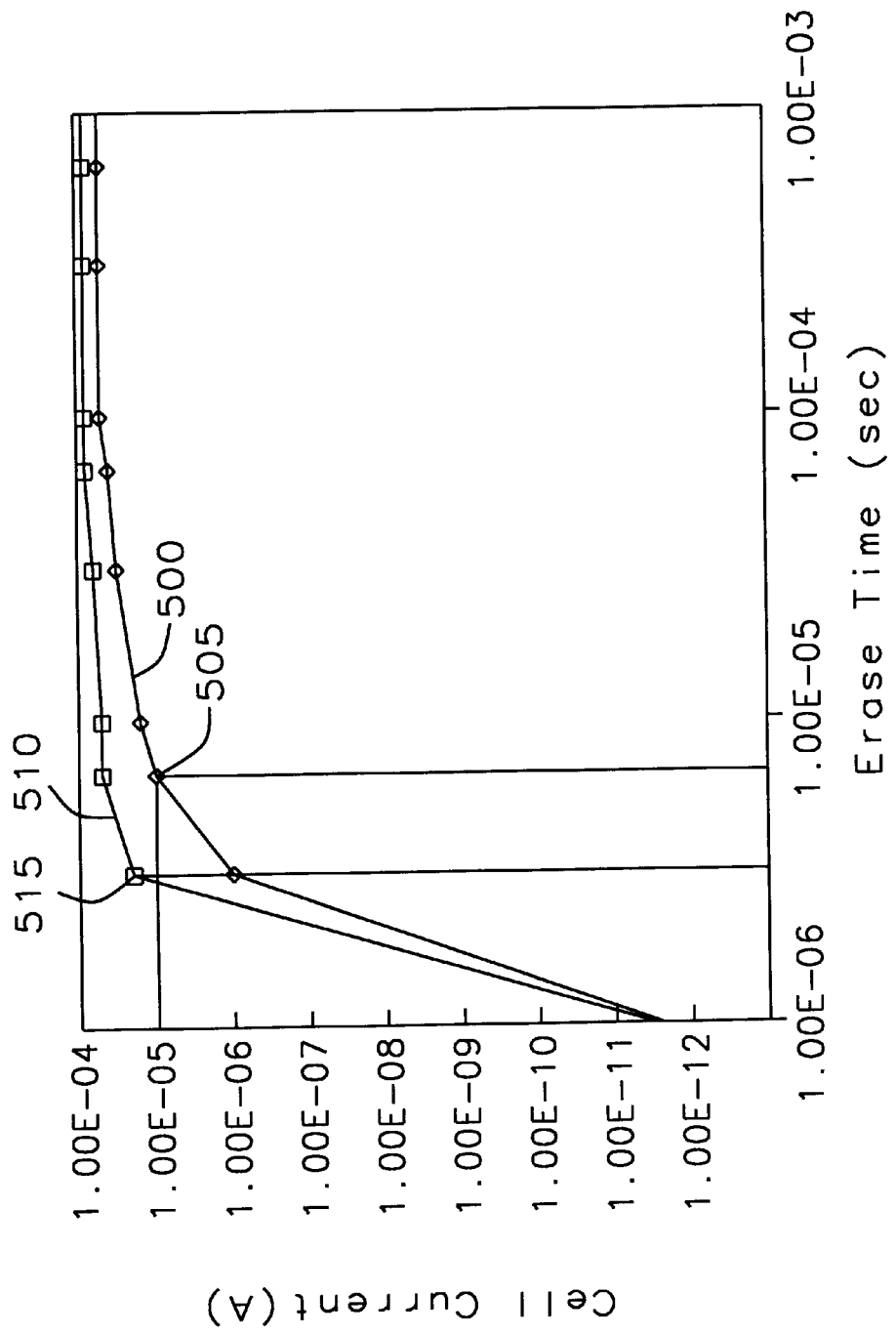
FIG. 5 is a plot of the erase current versus the erase time of the erase cycle time of this invention as compared to the erase cycle time of the prior art.

Refer now to FIG. 5 for a discussion of the erase time of the method to erase a split gate flash EEPROM cell of this invention compared to the method to erase the split gate flash EEPROM cell of Jenq. The plots of FIG. 5 show the function of the cell current after erasing versus the time to execute the erase. The plot 500 shows the cell current for the erase method of applying a ground reference potential (0V) to the substrate 5 of FIG. 1 as described in Jenq. At a cell current of approximately 10 μA, the erase time 505 is approximately 7 μsec. At a cell current of approximately 10 μA, the plot 510 shows the results of the method of erasure for this invention. The method of this invention has an erase time 515 of 3.0 μsec. The plots 500 and 510 demonstrate that the method of this invention has a faster erase time than that described in Jenq, where the ground reference potential (0V) is applied to the substrate 5 of FIG. 1.

Figure 6:
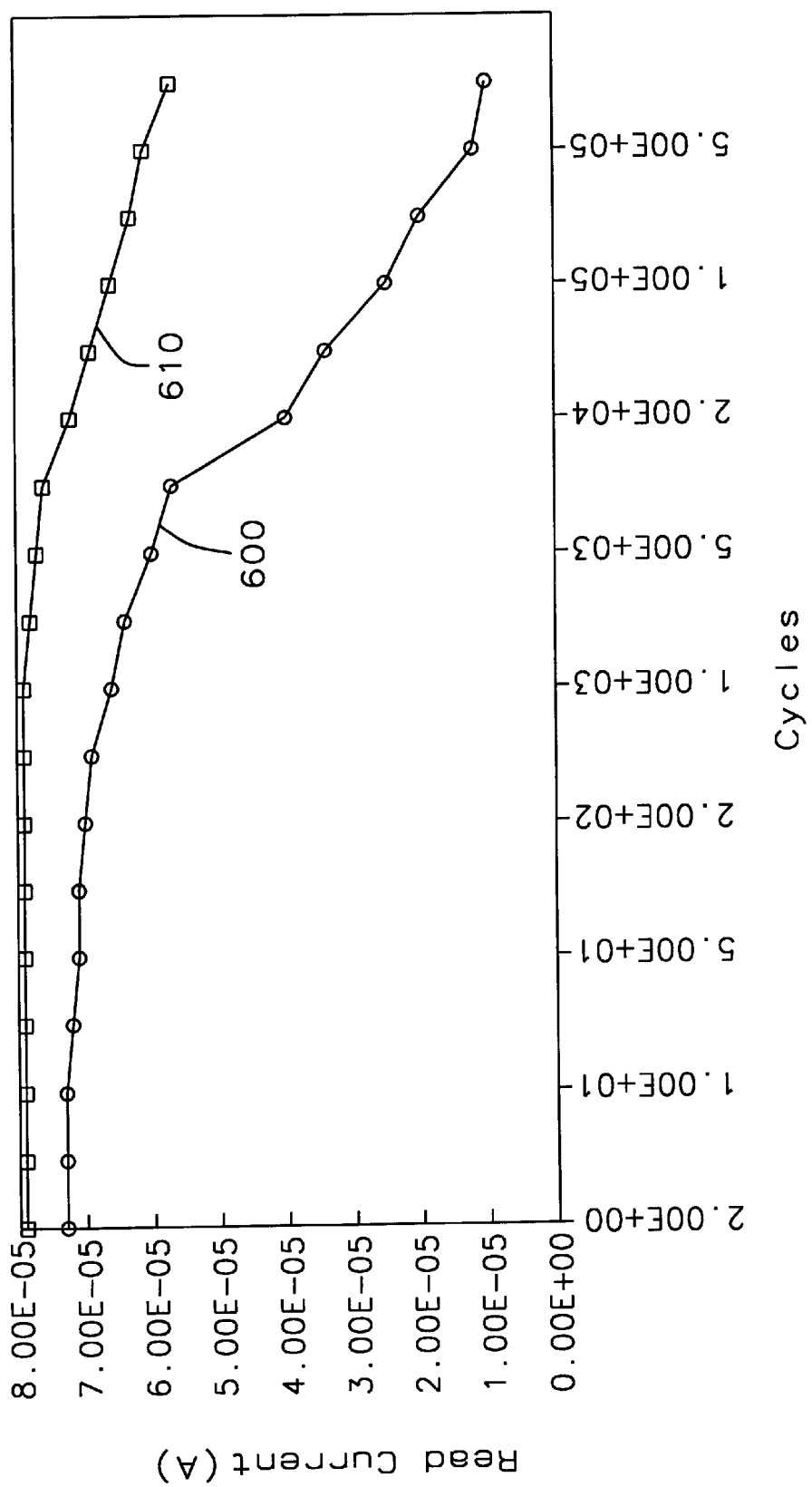
FIG. 6 is a plot of the read current versus the number of program/erase cycles to compare the endurance of the split gate flash EEPROM employing the method of programming and erasing of this invention as compared with the method of programming and erasing of the prior art.

FIG. 6 shows the level of endurance of a split gate EEPROM cell comparing the method of erasure of this invention to that as described in Jenq, where the ground reference potential (0V) is applied to the substrate 5 of FIG. 1.

The endurance is a measure of the level of damage to the tunneling peak in the region of the interpoly dielectric layer 25 near the side wall 26. The level of damage will degrade the ability erase the split gate flash EEPROM cell 100 of FIG. 1. The read current wall decrease as the damage is increased since electrons will remain trapped on the floating gate 30 of FIG. 1. This will decrease the ability to read the data from the split gate flash EEPROM cell 100.

The plot 600 shows the endurance of the split gate flash EEPROM employing the method of erasure described in Jenq. The plot 610 shows the endurance of the split gate flash EEPROM employing the method of erasure of this invention. It is apparent that the method of erasure of this invention will improve the endurance of the split gate EEPROM.

Refer back now to FIG. 1 for a discussion of the advantage of the method of this invention compared to increasing the voltage level of the control gate voltage generator $V_{cg}$ 35 and maintaining the substrate voltage generator $V_{sub}$ 45 at the ground reference potential (0V). Increasing the voltage level of the control gate voltage generator $V_{cg}$ 35 and maintaining the substrate voltage generator $V_{sub}$ 45 at the ground reference potential (0V) will also improve the erasing and endurance characteristics of a split gate flash EEPROM 100 of FIG. 1. However, higher voltage levels applied to the control gate 20 require a thicker gate dielectric 55 and a longer channel region 60 compared to the method of this invention. Further, isolation separating the split gate flash EEPROM cells on a substrate will need to be thicker for split gate flash EEPROM Cells 100 having a higher voltage applied to the control gate 20 in order to reduce the effects of parasitic devices. These factors complicate the process of manufacture of the split gate flash EEPROM cell 100. The complication of the process is especially aggravated as the process advances into the deep sub-micron technology. Whereas, the method of programming and erasing a split gate flash EEPROM of this invention will improve programming and erasing speed without having to change the above described design considerations.

While this invention has been particularly shown and described with reference to the preferred embodiments thereof, it will be understood by those skilled in the art that various changes in form and details may be made without departing from the spirit and scope of the invention.

The invention claimed is:

1. A method for programming and erasing a split gate flash EEPROM cell, whereby said split gate flash EEPROM cell comprises a drain region and a source region diffused in a semiconductor substrate, a floating gate placed on a field oxide overlapping said source region and said semiconductor substrate in a channel region between the source region and the drain region, a control gate placed on the field oxide overlapping said drain region and said semiconductor substrate in the channel region and on an interpoly dielectric above the floating gate, wherein the method comprises the steps of:

programming said split gate flash EEPROM cell by simultaneously applying a first positive voltage to the control gate, applying a first moderately negative voltage to the semiconductor substrate, applying a slight positive potential to the drain region to supply a constant programming current, and applying a second positive voltage to the source region, whereby said first positive voltage, said first moderately negative voltage, the slight positive potential, and said second positive voltage are applied for a sufficient time to cause hot electrons to be trapped on the floating gate; and erasing said split gate flash EEPROM cell by simultaneously applying a large positive voltage to the control gate, applying the first moderately negative voltage to the semiconductor substrate, and applying a second moderately negative voltage to the source region, whereby said large positive voltage, said first moderately negative voltage, and said second moderately negative voltage are applied for a sufficient time to institute Fowler-Nordheim tunneling from the floating gate to the control gate to eliminate any electrons from said floating gate.

2. The method of programming and erasing a split gate flash EEPROM cell of claim 1 wherein erasing said split gate flash EEPROM cell further comprises simultaneously applying a ground reference potential to the drain region.

3. The method of programming and erasing a split gate flash EEPROM cell of claim 1 wherein erasing said split gate flash EEPROM cell further comprises simultaneously floating the drain region.

4. The method of programming and erasing a split gate flash EEPROM cell of claim 1 wherein the first positive voltage is from approximately +3.0V to approximately 5.5V, preferably 3.0V.

5. The method of programming and erasing a split gate flash EEPROM cell of claim 1 wherein the first moderately negative voltage is from approximately −1.0V to approximately −3.0V, preferably −2.0V.

6. The method of programming and erasing a split gate flash EEPROM cell of claim 1 wherein the large positive voltage is from approximately +10.0V to approximately +12.0V, preferably +11.0V.

7. The method of programming and erasing a split gate flash EEPROM cell of claim 1 wherein the second positive voltage is from approximately 9.0V to approximately 10.0V, preferably +9.5V.

8. The method of programming and erasing a split gate flash FEPROM cell of claim 1 wherein the slight positive potential is from approximately 0.6V to approximately 0.8V, preferably 0.7V to supply a constant programming current of −5 $\mu$A.

9. The method of programming and erasing a split gate flash EEPROM cell of claim 1 wherein the second moderately negative voltage is from approximately −1.0V to approximately −3.0V, preferably −2.0V.

10. The method of programming and erasing a split gate flash EEPROM cell of claim 1 wherein the time sufficient to trap electrons on the floating gate is from approximately 2.0 $\mu$sec. to 20 $\mu$sec.

11. The method of programming and erasing a split gate flash EEPROM cell of claim 1 wherein the time sufficient to institute Fowler-Nordheim tunneling and eliminate electrons from the floating gate is from approximately 10 $\mu$sec. to approximately 1 m sec.

12. A split gate non-volatile semiconductor memory device comprising:

a semiconductor substrate of a first conductivity type;

a pair of diffusions of a second conductivity type spaced distally from one another to form a source region and a drain region within said semiconductor substrate;

a thin gate oxide insulation disposed upon said semiconductor substrate in a region generally between the source region and the drain region in correspondence with a channel region and having a thickness which allows tunneling of carriers there through;

a floating gate disposed upon said thin gate oxide insulation generally in correspondence with said channel region and overlapping said source region;

an interpoly dielectric insulation disposed upon said floating gate to insulate said floating gate;

a control gate disposed upon said thin gate oxide insulation above said channel region and overlapping said drain region and above said interpoly dielectric insulation overlapping said floating gate; and a programming and erasing a means to store electrical charges to and remove electrical charges from said floating gate by the steps of:

programming said split gate non-volatile semiconductor memory device by simultaneously applying a first positive voltage to the control gate, applying a first moderately negative voltage to the semiconductor substrate, applying a slight positive potential to the drain region to supply a constant programming current, and applying a second positive voltage to the source region, whereby said first positive voltage, said first moderately negative voltage, the slight positive potential, and said second positive voltage are applied for a sufficient time to cause hot electrons to be trapped on the floating gate; and erasing a said split gate non-volatile semiconductor memory device by simultaneously applying a large positive voltage to the control gate, applying the first moderately negative voltage to the semiconductor substrate, and applying a second moderately negative voltage to the source region, whereby said large positive voltage, said first moderately negative voltage, and said second moderately negative voltage are applied for a sufficient time to institute Fowler-Nordheim tunneling from the floating gate to the control gate to eliminate any electrons from said floating gate.

13. The split gate non-volatile semiconductor memory device of claim 12 wherein erasing a said split gate non-volatile semiconductor memory device further comprises simultaneously applying a ground reference potential to the drain region.

14. The split gate non-volatile semiconductor memory device of claim 12 wherein erasing a said split gate non-volatile semiconductor memory device further comprises simultaneously floating the drain region.

15. The split gate non-volatile semiconductor memory device of claim 12 wherein the first positive voltage is from approximately +3.0V to approximately 5.5V, preferably 3.0V.

16. The split gate non-volatile semiconductor memory device of claim 12 wherein the first moderately negative voltage is from approximately −1.0V to approximately −3.0V, preferably −2.0V.

17. The split gate non-volatile semiconductor memory device of claim 12 wherein the large positive voltage is from approximately +10.0V to approximately +12.0V, preferably +11.0V.

18. The split gate non-volatile semiconductor memory device of claim 12 wherein the second positive voltage is from approximately 9.0V to approximately 10.0V, preferably +9.5V.

19. The split gate non-volatile semiconductor memory device of claim 12 wherein the slight positive potential is from approximately 0.6V to approximately 0.8V, preferably 0.7V to supply a constant programming current of −5 $\mu$A.

20. The split gate non-volatile semiconductor memory device of claim 12 wherein the second moderately negative voltage is from approximately −1.0V to approximately −3.0V, preferably −2.0V.

21. The split gate non-volatile semiconductor memory device of claim 12 wherein the time sufficient to trap electrons on the floating gate is from approximately 2.0 $\mu$sec. to 20 $\mu$sec.

22. The split gate non-volatile semiconductor memory device of claim 12 wherein the time sufficient to institute Fowler-Nordheim tunneling and eliminate electrons from the floating gate is from approximately 10 $\mu$sec. to approximately 1 m sec.

23. A split gate non-volatile semiconductor memory device comprising:

a semiconductor substrate of a first conductivity type;

a plurality of split gate flash EEPROM cells arranged in an array wherein each cell comprises:

a pair of diffusions of a second conductivity type spaced distally from one another to form a source region and a drain region within said semiconductor substrate, a thin gate oxide insulation disposed upon said semiconductor substrate in a region generally between the source region and the drain region in correspondence with a channel region and having a thickness which allow tunneling of carriers there through, a floating gate disposed upon said thin gate oxide insulation generally in correspondence with said channel region and overlapping said source region, an interpoly dielectric insulation disposed upon said floating gate to insulate said floating gate, a control gate disposed upon said thin gate oxide insulation above said channel region and overlapping said drain region and above said interpoly dielectric insulation overlapping said floating gate; and a programming and erasing a means to store electrical charges to and remove electrical charges from said floating gate by the steps of:

programming one split gate flash EEPROM cell by simultaneously applying a first positive voltage to the control gate, applying a first moderately negative voltage to the semiconductor substrate, applying a slight positive potential to the drain region to supply a constant programming current, and applying a second positive voltage to the source region, whereby said first positive voltage, said first moderately negative voltage, the slight positive potential, and said second positive voltage are applied for a sufficient time to cause hot electrons to be trapped on the floating gate; and erasing a one split gate flash EEPROM cell by simultaneously applying a large positive voltage to the control gate, applying the first moderately negative voltage to the semiconductor substrate, and applying a second moderately negative voltage to the source region, whereby said large positive voltage, said first moderately negative voltage, and said second moderately negative voltage are applied for a sufficient time to institute Fowler-Nordheim tunneling from the floating gate to the control gate to eliminate any electrons from said floating gate.

24. The split gate non-volatile semiconductor memory device of claim 23 wherein erasing a said one split gate flash EEPROM cell further comprises simultaneously applying a ground reference potential to the drain region.

25. The split gate non-volatile semiconductor memory device of claim 23 wherein erasing said one split gate flash EEPROM cell further comprises simultaneously floating the drain region.

26. The split gate non-volatile semiconductor memory device of claim 23 wherein the first positive voltage is from approximately +3.0V to approximately 5.5V, preferably 3.0V.

27. The split gate non-volatile semiconductor memory device of claim 23 wherein the first moderately negative voltage is from approximately −1.0V to approximately −3.0V, preferably −2.0V.

28. The split gate non-volatile semiconductor memory device of claim 23 wherein the large positive voltage is from approximately +10.0V to approximately +12.0V, preferably +11.0V.

29. The split gate non-volatile semiconductor memory device of claim 23 wherein the second positive voltage is from approximately 9.0V to approximately 10.0V, preferably +9.5V.

30. The split gate non-volatile semiconductor memory device of claim 23 wherein the slight positive potential is from approximately 0.6V to approximately 0.8V, preferably 0.7V to supply a constant programming current of −5 $\mu$A.

31. The split gate non-volatile semiconductor memory device of claim 23 wherein the second moderately negative voltage is from approximately −1.0V to approximately −3.0V, preferably −2.0V.

32. The split gate non-volatile semiconductor memory device of claim 23 wherein the time sufficient to trap electrons on the floating gate is from approximately 2.0 $\mu$sec. to 20 $\mu$sec.

33. The split gate non-volatile semiconductor memory device of claim 23 wherein the time sufficient to institute Fowler-Nordheim tunneling and eliminate electrons from the floating gate is from approximately 10 $\mu$sec. to approximately 1 m sec.

34. A programming and erasing a device to store and to remove charges from a split gate flash EEPROM cell, whereby said split gate flash EEPROM cell comprises a drain region and a source region diffused in a semiconductor substrate, a floating gate placed on an thin oxide layer overlapping said source region and said semiconductor substrate in a channel region between the source region and the drain region, a control gate placed on the thin oxide layer overlapping said drain region and said semiconductor substrate in the channel region and on an interpoly dielectric above the floating gate, comprising:

a first voltage source coupled to the control gate;

a second voltage source coupled to the source region;

a third voltage source coupled to the drain region;

a fourth voltage source coupled to the semiconductor substrate; and a programming and erasing a control means coupled to the first, second, third, and fourth voltage sources to control said first, second, third, and fourth voltage sources wherein programming said split gate flash EEPROM cell is accomplished by:

forcing the first voltage source to a first positive voltage, forcing the fourth voltage source to a first moderately negative voltage, forcing the third voltage source to a slight positive potential to provide a constant programming current, and forcing the second voltage source to a second positive voltage to the source region, whereby said first positive voltage, said first moderately negative voltage, slight positive potential, and said second positive voltage are applied for a sufficient time to cause hot electrons to be trapped on the floating gate, and wherein erasing said split gate flash EEPROM cell is accomplished by:

forcing the first voltage source to a large positive voltage, forcing the fourth voltage source to the first moderately negative voltage to the semiconductor substrate, and forcing the second voltage source to a second moderately negative voltage, whereby said large positive voltage, said first moderately negative voltage, and said second moderately negative voltage are applied for a sufficient time to institute Fowler-Nordheim tunneling from the floating gate to the control gate to eliminate any electrons from said floating gate.

35. The programming and erasing a device of claim 34 wherein erasing said split gate flash EEPROM cell further comprises simultaneously applying a ground reference potential to the drain region.

36. The programming and erasing a device of claim 34 wherein erasing a said split gate flash EEPROM cell further comprises simultaneously floating the drain region.

37. The programming and erasing a device of claim 34 wherein the first positive voltage is from approximately +3.0V to approximately 5.5V, preferably 3.0V.

38. The programming and erasing a device of claim 34 wherein the first moderately negative voltage is from approximately −1.0V to approximately −3.0V, preferably −2.0V.

39. The programming and erasing a device of claim 34 wherein the large positive voltage is from approximately +10.0V to approximately +12.0V, preferably +11.0V.

40. The programming and erasing a device of claim 34 wherein the second positive voltage is from approximately 9.0V to approximately 10.0V, preferably +9.5V.

41. The programming and erasing a device of claim 34 wherein the slight positive potential is from approximately 0.6V to approximately 0.8V, preferably 0.7V to supply a constant programming current of −5 μA.

42. The programming and erasing a device of claim 34 wherein the second moderately negative voltage is from approximately −1.0V to approximately −3.0V, preferably −2.0V.

43. The programming and erasing a device of claim 34 wherein the time sufficient to trap electrons on the floating gate is from approximately 2.0 μsec. to 20 μsec.

44. The programming and erasing a device of claim 34 wherein the time sufficient to institute Fowler-Nordheim tunneling and eliminate electrons from the floating gate is from approximately 10 μsec. to approximately 1 m sec.

* * * * *